United States Patent [19]

Krauss et al.

[11] Patent Number: 4,923,585
[45] Date of Patent: May 8, 1990

[54] SPUTTER DEPOSITION FOR MULTI-COMPONENT THIN FILMS

[75] Inventors: Alan R. Krauss, Plainfield, Ill.; Orlando Auciello, Cary, N.C.

[73] Assignee: Arch Development Corporation, Argonne, Ill.

[21] Appl. No.: 266,196

[22] Filed: Nov. 2, 1988

[51] Int. Cl.$^5$ .............................................. C23C 14/34
[52] U.S. Cl. ........................ 204/298.04; 204/192.11; 204/298.03
[58] Field of Search ................... 204/192.11, 298 BD, 204/298 MT

[56] References Cited

U.S. PATENT DOCUMENTS

| | | | |
|---|---|---|---|
| 3,117,022 | 1/1964 | Bronson et al. | 204/298 BD |
| 4,033,843 | 7/1977 | Krikorian et al. | 204/298 BD X |
| 4,142,958 | 3/1979 | Wei et al. | 204/298 BD X |
| 4,376,688 | 3/1983 | Caesar et al. | 204/192.11 |
| 4,793,908 | 12/1988 | Scott et al. | 204/298 BD X |

OTHER PUBLICATIONS

Weissmantel et al., "Preparation . . . Coatings", Thin Solid Films, 96 (1982) 31–44.

*Primary Examiner*—Nam X. Nguyen
*Attorney, Agent, or Firm*—Emrich & Dithmar

[57] ABSTRACT

Ion beam sputter-induced deposition using a single ion beam and a multicomponent target is capable of reproducibly producing thin films of arbitrary composition, including those which are close to stoichiometry. Using a quartz crystal deposition monitor and a computer controlled, well-focused ion beam, this sputter-deposition approach is capable of producing metal oxide superconductors and semiconductors of the superlattice type such as GaAs-AlGaAs as well as layered metal/oxide/semiconductor/superconductor structures. By programming the dwell time for each target according to the known sputtering yield and desired layer thickness for each material, it is possible to deposit composite films from a well-controlled sub-monolayer up to thicknesses determined only by the available deposition time. In one embodiment, an ion beam is sequentially directed via a set of X-Y electrostatic deflection plates onto three or more different element or compound targets which are constituents of the desired film. In another embodiment, the ion beam is directed through an aperture in the deposition plate and is displaced under computer control to provide a high degree of control over the deposited layer. In yet another embodiment, a single fixed ion beam is directed onto a plurality of sputter targets in a sequential manner where the targets are each moved in alignment with the beam under computer control in forming a multilayer thin film. This controlled sputter-deposition approach may also be used with laser and electron beams.

20 Claims, 4 Drawing Sheets

SPUTTER DEPOSITION FOR MULTI-COMPONENT THIN FILMS

CONTRACTUAL ORIGIN OF THE INVENTION

The United States Government has rights in this invention pursuant to Contract No. W-31-109-ENG-38 between the U.S. Department of Energy and the University of Chicago representing Argonne National Laboratory.

BACKGROUND OF THE INVENTION

This invention relates generally to the formation of thin films by sputter-deposition and is particularly directed to the sputter-deposition of thin films of precisely controlled composition and dimensions using a single ion, electron or laser beam and a multicomponent target.

Immediately after the discovery of high $T_c$ bulk superconductor materials at 40 K and 90 K, an intense research activity was initiated to develop processes for the fabrication of high $T_c$ thin film superconductors. Several techniques have been demonstrated for the deposition of these films, including: (a) electron beam-induced coevaportation and multilayer deposition of elemental Y, Ba, and Cu, (b) plasma and ion beam sputter-induced deposition from irradiated bulk superconductors, (c) pulsed laser evaporation of bulk superconductors, and (d) molecular beam epitaxy. To date, the ion beam sputter-deposition method has been demonstrated only with targets consisting of bulk superconductors, e.g., $La_{1.8}Sr_{0.2}CuO_4$ and $YBa_2Cu_3O_{7-x}$.

In general, ion bombardment-induced sputtering produces ejection of surface atoms via ion-induced collision cascades in the solid, the ejected atoms having energy distributions with peaks at 2-5 eV for normal incidence bombardment and up to several hundred eV for bombardment at oblique angles of incidence. This may present an advantage over vaporization methods mentioned above in that the higher energy of the sputtered species may result in implantation into the substrate, producing improved adhesion of the thin film. A problem related to sputtering of multicomponent materials (alloys and compounds) is that preferential sputtering may lead to compositional changes to a certain depth below the surface of the sputtering target. The composition of the deposited films will therefore vary with sputtering time. This is, however, a transient condition since a steady-state composition will be produced in which the sputtering rate of the constituent species is proportional to the bulk composition. Unfortunately, in some cases, a relatively thick layer ($\sim 0.5$ $\mu$m) must be removed before the steady-state condition is reached. The stoichiometry of sputter-deposited films, prior to the annealing process necessary to produce the superconducting phase, has been shown to be in general not the same as that of the bulk material used as the target. Additionally, the films have shown, in general, lower $T_c$'s than those characteristic of the bulk superconductors. This appears to also be the case for laser-deposited films. Two possible reasons for the lower $T_c$ values for the thin films could be a failure to exactly reproduce the stoichiometry of the bulk superconducting target and/or interdiffusion at the film-substrate interface during the annealing process. Recent studies have shown first evidence for laser and ion bombardment-induced compositional changes in $YBa_2Cu_3O_{7-x}$ targets which may be responsible for variations in film stoichiometry and for annealing-induced compositional changes in Y-Ba-Cu-O films.

In addition, strong surface-topographical changes have been observed in ion- and laser-irradiated bulk single phase $YBa_2Cu_3O_{7-x}$ targets, the development of a dense forest of large cones being the most noticeable effect. Referring to FIG. 1a, there are shown cones developed on a $YBa_2Cu_3O_{7-x}$ single phase superconductor as a result of several hundred pulses of an XeCl excimer laser ($\lambda=0.308$ $\mu$m, 0.3J) during deposition of a high $T_c$ film. Shown in FIG. 1b is the sputter-induced (10 keV $Kr^+$) cones on a single phase $YBa_2Cu_3O_{7-x}$ superconductor target. It should be noted that the texture of the cones shown in FIG. 1a is different from that of the sputter cones shown in FIG. 1b which is indicative of a melting-resolidification process. The sputter cones shown in FIG. 1b are characteristic of the well-known collisional sputtering-induced mechanism of cone formation.

The electron beam induced evaporation and molecular beam epitaxy techniques, on the other hand, have an advantage over the currently used ion sputtering and laser evaporation induced deposition methods in that the elemental components, e.g., Y, Ba and Cu, can be vaporized to deposit films with controllable stoichiometry. This capability could be significant in that a slightly copper-rich phase of the Y-Ba-Cu-O or other oxide may provide a higher $T_c$, and it is therefore desirable to be able to make films with composition differing controllably from the $YBa_2Cu_3O_{7-x}$ stoichiometry. However, presently used configurations for electron beam evaporators and molecular beam epitaxy equipment require the use of either one electron gun or one oven for each component of the thin film. This approach results in increased cost and complexity of the equipment and also imposes the requirement of accurately matching the characteristics of all sources.

The present invention represents an improvement over the aforementioned prior art approaches through the use of a computer controlled, single ion beam with a quartz crystal monitor to produce deposited films of arbitrary composition as well as layered structures of arbitrary thickness. The present invention thus provides an alternative approach for the synthesis of high $T_c$ superconducting oxides and other multicomponent films, e.g., GaAs-AlGaAs superlattices, multicomponent oxides for opto-electronic applications, etc., which can be applied not only to the ion beam sputter-deposition method, but also to the electron and laser beam-induced vaporization methods.

OBJECTS AND SUMMARY OF THE INVENTION

Accordingly, it is an object of the present invention to provide improved control over the composition and stoichiometry of desorption deposited thin films.

It is another object of the present invention to produce thin films which depart in a controllable manner from the most stable stoichiometry using ion sputter-deposition techniques.

A further object of the present invention is to reduce the cost, complexity, and equipment size requirements of producing thin films of selected superconducting oxides, semiconductor superlattices, and other multicomponent thin films.

A still further object of the present invention is to provide a sputter-deposition system and method wherein the flux of all metallic components as well as the oxygen flux and implantation energy may be independently computer controlled and systematically varied to reproducibly produce thin films of arbitrary composition as well as layered structures of arbitrary thickness.

Yet another object of the present invention is to provide improved desorption deposition using either an ion beam, a laser, or an electron beam.

It is a further object of the present invention to form thin films using multiple sputtered targets and a single desorption inducing beam.

Still another object of the present invention is to provide an arrangement and method for depositing composite films from a well-controlled sub-monolayer up to thicknesses determined only by the length of deposition time.

Another object of the present invention is to provide an improved means and method for forming multicomponent thin films by ion sputtering as well as laser and electron vapor deposition.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DETAILED DESCRIPTION OF THE PREFERRED EMBODIMENT

Figure 1A:
FIG. 1a shows the cones developed on a $YBa_2Cu_3O_{7-x}$ single phase superconductor as a result of several hundred pulses of an XeCl excimer laser during deposition of high $T_c$ film.
Figure 1B:
FIG. 1b shows the sputter-induced cones on a single phase $YBa_2Cu_3O_{7-x}$ superconductor target which are characteristic of the well-known collisional sputtering-induced mechanism of cone formation.
Figure 2:
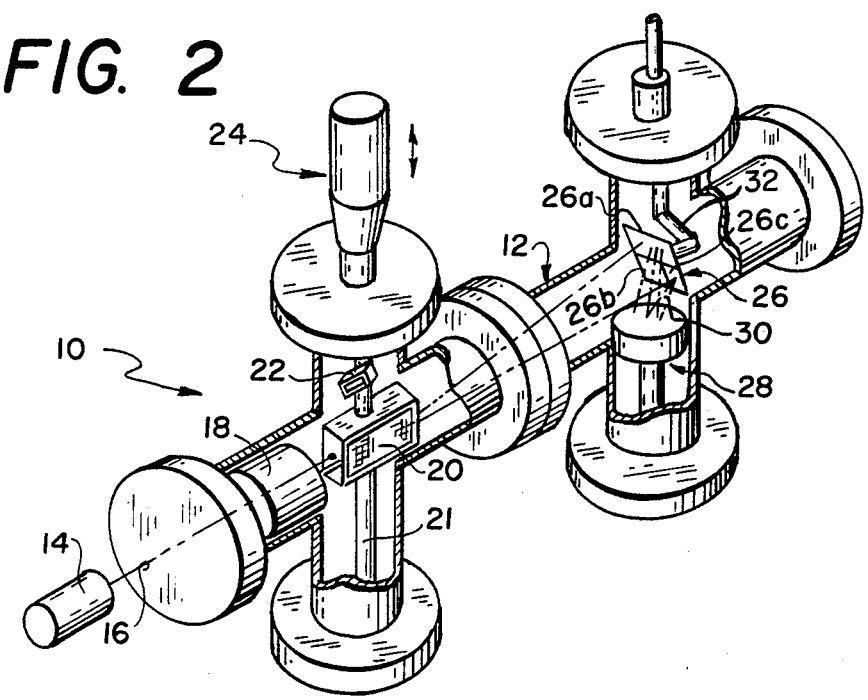
FIG. 2 is a simplified schematic diagram of one arrangement for ion beam sputter-deposition in accordance with the present invention which makes use of single ion beam deflection in combination with a multi-component sputtering target.

Referring to FIG. 2, there is shown in simplified schematic diagram form one embodiment of a sputter-deposition system 10 in accordance with the present invention. The sputter-deposition system 10 includes a vacuum chamber 12 into which is directed an ion beam 16 by means of an ion beam source 14. The ion beam 16 is directed through an ion lens 18 within the vacuum chamber 12. The ion lens 18 focuses the collimated ion beam 16 onto a small spot on a multi-element target 26.

Positioned downstream of the ion lens 18 within the vacuum chamber 12 is a beam deflector 20 comprised of four electrostatic plates arranged in a rectangular, box-like configuration. The ion beam deflector 20 is mounted to a shaft 21. Also mounted to the shaft 21 is a Faraday cup 22. The upper end of the shaft 21 is coupled to a micrometer drive 24 for displacing the shaft, as well as the ion beam deflector 20 and the Faraday cup 22, upward and downward within the vacuum chamber 12. The Faraday cup 22 is moved in position in line with the ion beam 26 prior t initiation of the sputtering operation in order to provide a measure of the ion beam current. After initial measurement of ion beam current intensity, the ion beam deflector 20 is then moved upward in alignment with the ion beam 16 for steering the ion beam onto the multi-element target 26. The multi-element target 26 is coupled to and suspended from a target support element 32. As shown in the embodiment of FIG. 2, the multi-element target 26 is comprised of three target materials 26a, 26b and 26c onto each of which the ion beam 16 is deflected by the ion beam deflector 20 in a sequential manner. The sputtered ions 30 emitted by each of these target materials in response to the incident ion beam 26 are directed onto a heatable deposition substrate 28 on which is formed a multilayer substrate, with each layer comprised of one of the three target materials.

In one embodiment, an Atomika ion source 14 directs a mass-analyzed ion beam such as comprised of $Ar^+, Kr^+$, etc., ions through an ion lens 18, or einzellens, followed by two pairs of electrostatic deflection plates in the ion beam deflector plate 20. The einzellens forms the ion beam into a well-defined spot, and the aforementioned deflection plates deflect the ion beam 16 onto the desired target material within the multi-element target 26. The beam spot is sufficiently well defined to guarantee that there is no spill-over from one target to another. The target support or holder 32 is shielded from the ion beam 16 by the multielement target 26, eliminating the possibility of contamination of the film deposited on the heatable deposition substrate 28 by sputtering from the target holder.

The separate sputtering targets 26a, 26b and 26c need not be elemental. For example, it is possible to make slight changes in the stoichiometry of a thin film, compared with the bulk material, by using the latter as one of the targets, ånd some of the elemental constituents of the bulk material as other targets. Thus, a slightly copper-rich form of $YBa_2Cu_3O_{7-x}$ superconducting material may be made by using the compound as one target and copper as another.

To demonstrate the concept, a Kr+ ion beam (10 keV, ~ 3 μm amp) 2 mm in diameter was used to sputter material from Cu, Ba (oxide) and Y targets in the form of square plates which were positioned on a holder pointed at an angle of 45° with respect to both the direction of the incident ion beam 16 and the substrate holder 28 as shown in FIG. 2. The substrate holder was capable of being heated to a temperature of 500° C. during deposition. The ion beam dwell time on Cu was estimated by using the known sputtering yields from the applicable reference tables. For Ba and Y, the sputtering yield $S_{Ba}$ and $S_y$ were extrapolated, by using the collisional sputtering model, from published yields of Hf and Zr which are near neighbors in the periodic table:

$$S_{Ba} = S_{Hf} \Delta H_s(Hf) / \Delta H_s(Ba) \quad (1)$$

$$S_Y = S_{Zr} \Delta H_s(Zr) / \Delta H_s(Y) \quad (2)$$

where $\Delta H_s$ is the heat of sublimation of the indicated element. The required beam dwell time $\tau_D$ for the ith component is given by:

$$\tau^i_D = \tau_o X_i / S_i \quad (3)$$

where $X_i$ is the desired formula composition for the ith component and $\tau_o$ is a reference time interval which determines the amount of the ith element which is deposited before deflecting the beam to the next target.

Figure 3:
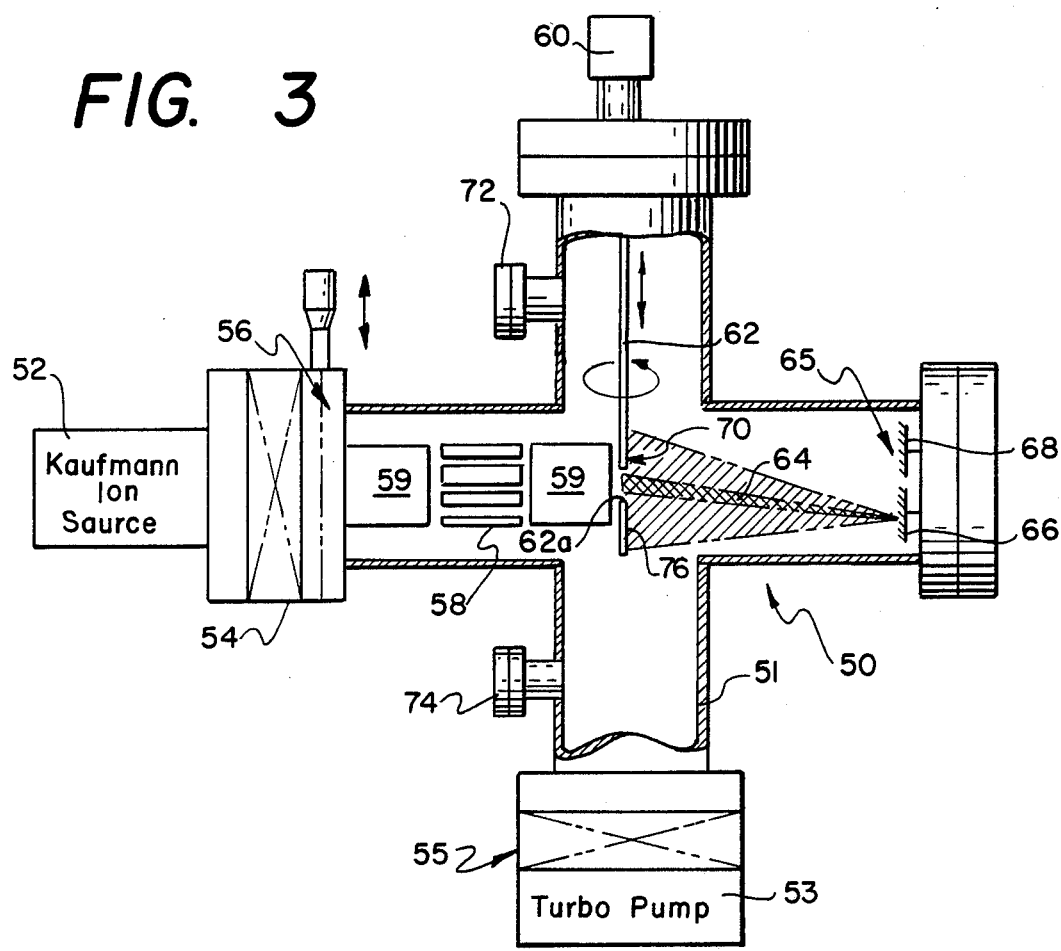
FIG. 3 is a simplified schematic diagram of another embodiment of a sputter-deposition system in accordance with the present invention also employing single ion beam displacement relative to a multi-component sputtering target under the control of a computer.

Referring to FIG. 3, there is shown another embodiment of a sputter-deposition system 50 in accordance with the present invention. The arrangement of FIG. 3 allows for the use of greater ion beam currents which reduces the irradiation time and improves target-substrate geometry for improved uniformity in film composition over that offered by the embodiment of FIG. 2. A Kaufmann ion source 52 is used in the second embodiment because of its very high beam current (up to several hundred mA), parallel grid extraction optics, and low energy spread. These latter two properties make it possible to use a movable aperture plate 56 within a first gate valve 54 to limit the source size and to permit the low abberration focusing and deflection optics 59 and 58 to provide a well-defined high current beam to one of a plurality of targets 66 and 68. This capability is needed to ensure that the ion beam 64 strikes only the designated target and does not introduce contamination from adjacent targets or from the wall of the vacuum chamber 51. Further, the ion beam 64 is normally incident on the targets 66, 68 in order to minimize the cross section of the ion beam as it strikes them. The substrate 70 is placed on a substrate support member 62 normal to ensure uniform deposition. The substrate support member 62 may be rotated as well as raised to a position in front of an electron bombardment heater 72 by means of a linear/rotary motor drive 60. The substrate support member 62 includes an aperture 62a through which the ion beam 64 is directed after it is deflected by the deflection optics 58. The sputtered atoms are then deposited on the substrate support member 62 generally in a symmetric manner relative to the aperture 62a in the support member. Low pressure oxygen may be admitted to the vacuum vessel 51 by means of a gas admission port 74 to allow for in-situ oxidation of the deposited film. A turbo pump 53 maintains the vacuum vessel 51 at a selected pressure. If desired, thicker films may be produced by sequential deposition/oxidation cycles. Computer control of ion beam deflection, as described in detail below, allows for multiple cycles of sputter-deposition, oxygen implantation, heating and oxygen annealing which may be carried out without operator intervention.

In the embodiment of FIG. 3, the deposition substrate 70 is placed upon the substrate support member 62 immediately above the aperture 62a within the support member. Symmetrically disposed below the aperture 62a is a quartz crystal deposition monitor 76 which provides a real time measure of the extent of thin film deposited on the support member 62. The quartz crystal deposition monitor 76 may be coupled to conventional measuring and display apparatus (not shown for simplicity) to provide a real time measure of the extent of thin film deposited upon the support member 62. While only two targets 66 and 68 are shown in FIG. 3, virtually any number of sputtering targets may be used in the embodiment of FIG. 3, depending upon the composition of the deposition substrate desired. In a preferred embodiment, the two targets 66 and 68 are symmetrically positioned relative to the undeflected axis of the ion beam 64 to ensure symmetrical deposition of the target material above and below the aperture 62a within the support member 62 for highly precise measurement of sputtering target deposition rates.

Figures 4, 8:
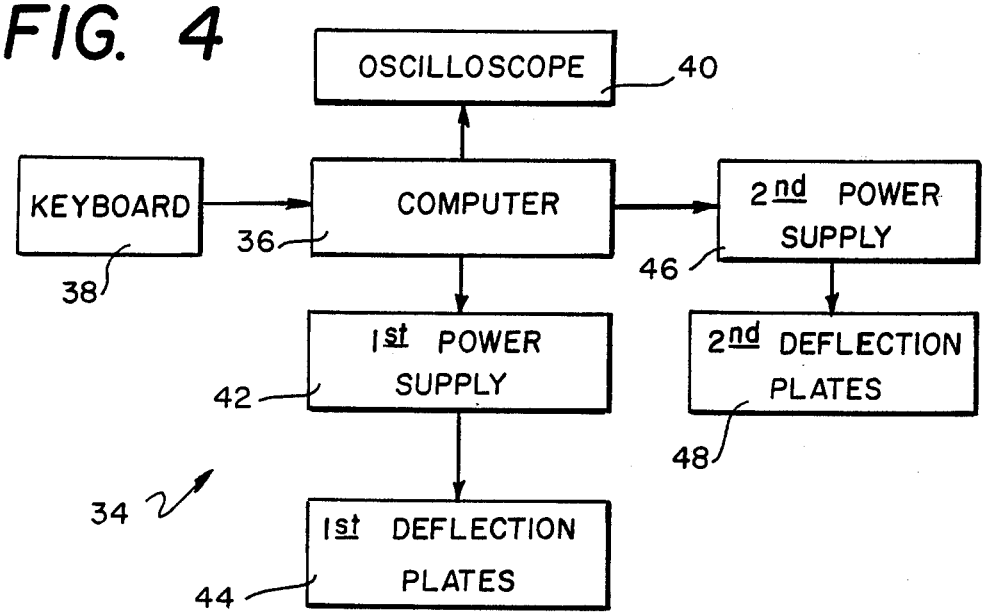
FIG. 4 is a simplified block diagram of a controller for use in the embodiments of the present invention shown in FIGS. 2 and 3.
FIG. 8 illustrates a control panel for the entry of commands and presentation of operating information for use in the present invention.

Referring to FIG. 4, there is shown in simplified block diagram form a controller 34 for use in either of the sputter-deposition systems illustrated in FIGS. 2 and 3. The controller 34 includes a computer 36 which in one embodiment is a DEC LSI 11/73 computer. The computer 36 is coupled to use input means such as a keyboard 38 for the entry of system operating parameters such as sputter rates from sputter deposition reference tables and the desired thickness of the various deposited layers. In one embodiment, the computer 36 is coupled to an oscilloscope 40 having an X and Y display which can be correlated to the location of incidence of the beam upon the sputter target. The oscilloscope 40 can then be used to provide a visual indication of the location of incidence of the beam upon the sputter target. The computer 36 is further coupled to first and second power supplies 42, 46 which are respectively, in turn, coupled to first and second pairs of deflection plates 44 and 48. As described above, the computer 36 provides two output voltages in the range of −10 volts to +10 volts via respective digital-analog converters, which are not shown in FIG. 4 for simplicity. These computer-generated scan signals are also provided to the X and Y deflection inputs of oscilloscope 40 and are used as programming voltages for the first and second power supplies 42, 46 which are programmable power supplies such as Kepco BOPS 1000 bipolar power supplies. The absorbed ion beam current detected by a picoammeter (not shown) is used to modulate the intensity of the display on the oscilloscope 40 in mapping out the positions of the various targets by their differing secondary electron yields. The +1000 volt outputs of the programmable first and second power supplies 42, 46 are applied to the first and second deflection plates 44, 48, respectively, which are used to position the beam on the target.

Figure 5:
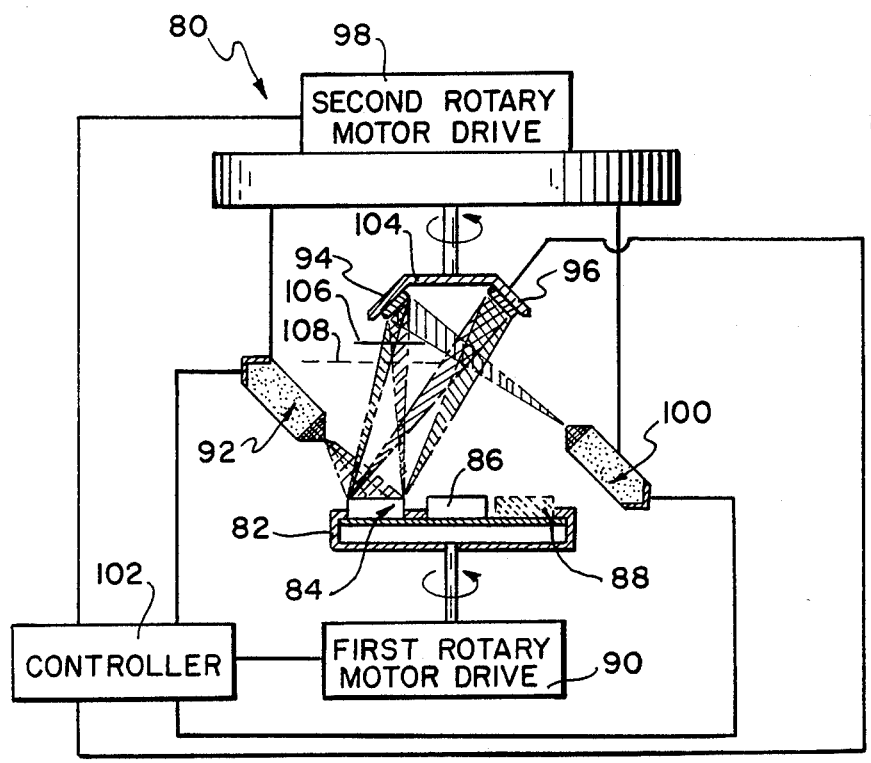
FIG. 5 is a simplified schematic diagram of yet another embodiment of a sputter-deposition arrangement in accordance with the present invention which makes use of a movable, multi-component sputtering target and a single fixed ion beam.

Referring to FIG. 5, there is shown yet another embodiment of a sputter-deposition system 80 in accordance with the principles of the present invention. In the arrangement of FIG. 5, a compact cold cathode ion/neutral source 92 directs a beam having a spot size on the order of 1 centimeter in diameter onto each one of a plurality of sputtering targets 84, 86 and 88. Instead of rastering the beam between stationary targets as in the first two embodiments, the sputter deposition system 80 shown in FIG. 3 uses a stationary beam in combination with the sputtering targets 84, 86 and 88 positioned on a rotating carousel 82. A first rotary motor drive 90 is coupled to the rotating carousel 82 for rotationally displacing the carousel and sequentially positioning each of the sputter targets 84, 86 and 88 in alignment with the particle beam from the ion/neutral source 92. The dwell time for each target is controlled by a controller 102 which takes the target sputtering yields into account as in the first two embodiments and as described in detail below. The atoms removed from each of the sputtering targets are directed onto a deposition substrate 94 and a quartz crystal deposition monitor 96. The deposition substrate 94 and deposition monitor 96 are symmetrically positioned relative to the angle of reflection of the incident beam passing through the center of the sputtering target to ensure that essentially equal numbers of atoms arrive at the deposition substrate and the deposition monitor to provide an accurate, real-time measure of sputtering target deposition rates. The time that the ion beam is on as well a the intensity of the ion beam is also controlled by the controller 102 which is coupled to the ion/neutral source 92.

Where a deposition substrate 94 having a large area is to be formed, it may be desirable to effect rotational displacement of a substrate/monitor support 104 in order to ensure a constant thickness of each of the sputtering target layers. Thus, a second rotary motor drive 98 may be coupled to the substrate/monitor support 104 for operation under the control of the controller 102 to ensure uniform thickness of each of the sputter target layers. A cold cathode oxygen ion source 100 may also be included so as to direct oxygen ions onto the deposition substrate 94 in forming an oxide layer, where desired. The cold cathode oxygen ion source 100 may also be coupled to the controller 102 for automatically forming the aforementioned oxide layers. Finally, a shutter 106 and an apertured mask 108 are shown disposed between the first sputtering target 84 upon which the beam is incident and the deposition substrate 94. The shutter 106 is comprised of a solid structure for isolating the deposition substrate 94 from the sputtering targets. This permits the surface of a sputtering target to be cleaned by energetic particles incident thereon prior to initiating the target sputtering operation. Conventional means may be used under the control of the controller 102 to position the shutter 106 in front of the deposition substrate 94 and to remove it therefrom to permit sputter deposition of the targets. Similarly, the apertured mask 108 may be selectively positioned in front of or removed from the deposition substrate 94 by conventional means. The apertures within the mask 108 allow for selective deposition of the sputtered atoms on the surface of the deposition substrate. By configuring the apertures within the mask 108 in accordance with the desired electrical leads and contacts on the deposition substrate 94, electrical connections may also be formed on the deposition substrate during the sputter deposition operation.

By using a sputtering source in which the beam is entirely neutral, it is possible to use a bulk oxide such as BaO for the targets. This ensures that the sputtering yield of the target does not change with time as the oxide overlayer is removed from a metallic target, and therefore ensures reproducible deposition rates. In addition, the use of an oxide target provides oxygen which will be incorporated in the film. This feature is useful when the desired film is an oxide such as the high $T_c$ superconducting oxides. In addition, provision can be made for a second source to produce an energetic neutral oxygen beam which is implanted directly into the substrate during deposition a shown in FIG. 4. In addition, a low energy oxygen atom source (not shown) may be provided so as to also bombard the substrate with sub-electron volt atomic oxygen for reduced damage and mixing and the production of well defined interfaces. The deposition substrate 94 and quartz crystal monitor 96 are mounted on a common platform 104 which may be rotated so that they interchange positions. The quartz crystal monitor 96 may also be used to measure the neutral oxygen flux from the second beam source 100. In this way, the flux of all metallic components as well as the oxygen flux and implantation energy may be independently controlled by the controller 102 and systematically varied to reproducibly produce films of arbitrary composition.

Figure 6:
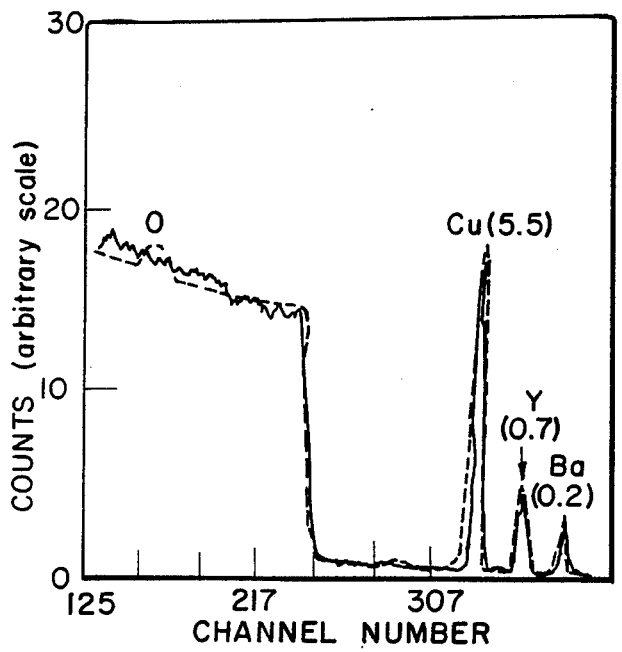
FIG. 6 is a Rutherford backscattering (RBS) spectrum of a Y-Ba-Cu-O film on the order of 100 Å thick deposited on Si (100) at 470° C. by a 10 keV $Kr^+$ beam incident on Y, Ba (oxide) and Cu targets.

FIG. 6 shows a spectrum from a Rutherford backscattering (RBS) analysis of an as-deposited Y-Ba-Cu-O film on a Si(100) substrate maintained at 470° C. during deposition. The dotted line represents the computer-simulated spectrum for an assumed composition. This curve is empirically matched to the experimental spectrum (full line) for the Y-Ba-Cu-O film in order to determine the experimentally measured film thickness and composition. It is clear that the film is Cu-rich and depleted in Y and Ba. The ion beam dwell time is based on the sputtering yield for clean metal surfaces. The sputtering yield for an oxide surface is likely to be different and possibly as much as 2-3x lower than that of the elemental metal, resulting in an underestimate of the required dwell time for the desired film stoichiometry. Consequently, it is necessary to monitor the deposition rates of the three elements in-situ in order to obtain completely predictable results with the method described here.

Figure 7:
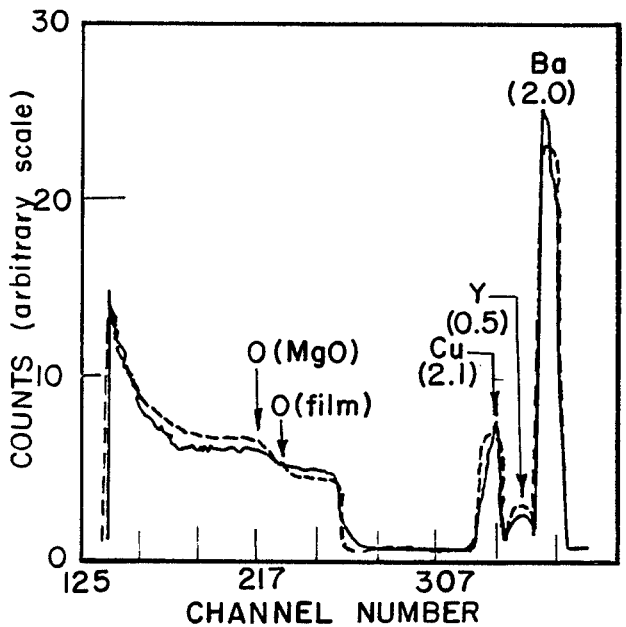
FIG. 7 is an RBS spectrum of a 1500 Å thick Y-Ba-Cu-O film deposited on MgO(100) at 465° C. by a 12 keV $O_2^+$ beam incident on Y, Ba (oxide) and Cu targets.

In order to establish a procedure for producing $YBa_2Cu_3O_{7-x}$ films in the present system, a second deposition on a MgO(100) substrate held at 465° C. was performed. The beam dwell times were determined by applying empirical correction factors to the sputtering yields used in Equations 1 and 2 based on the stoichiometry of the first film as derived from the RBS data of FIG. 6. Additionally, oxygen depletion has been observed in the initial films. A 12 keV $O_2^+$ beam was therefore used in this deposition in order to partially oxidize the film during deposition via backscattering of the incident beam and/or resputtering of oxygen initially implanted in the target. FIG. 7 shows an RBS spectrum of this film, which clearly shows, when compared with FIG. 6, that control of film stoichiometry is feasible and that an improved knowledge of the sputtering yields of elemental or oxidized targets will allow one to produce the desired stoichiometries The controller 102 shown in FIG. 5 is in one implementation, a Macintosh II computer running a program designed to provide full control over all the parameters relevant to the operation of the device shown in FIG. 5. The deposition process is divided into a series of steps, each one to be terminated by some condition pertaining to the lapse of a certain amount of time, or the establishment of a certain substrate temperature, oxygen pressure, or deposited film thickness.

A portion of the computer screen is shown in FIG. 8 to better illustrate the process. There are a number of buttons on the screen which are activated by pointing the mouse cursor and clicking the mouse button. Each step of the process is associated with a number of parameters which are established by typing values in the boxes shown in FIG. 8. The parameter boxes permit the shutter 108 and mask 106 to be inserted or removed, the desorption beam (Argon ions in this implementation) to be set on or off, the oxygen ion beam incident on the substrate to be set on or off, and its energy specified, and the low energy atomic oxygen source (not shown) turned on o off independently during each step. The parameters for a given step may be reviewed by clicking on the FIRST/PREVIOUS/NEXT/LAST buttons or entering the step number in the ACTIVE STEP box. All of the parameters for a given step may be altered simply by typing new values in the appropriate box. Additional steps may be added at any time and existing steps may be deleted from a deposition sequence by pressing the ADD or DELETE buttons. If a step is defined in a logically inconsistent manner (e.g. to be terminated by more than one criterion, or by an insufficiently defined single criterion) the START button is deactivated and the editing cursor is placed in the offending parameter box. Steps may be defined in any order and a given sequence of steps may be saved for later use as a parameter file by pressing the SAVE button and assigning a file name when presented with a prompt and a list of previously existing parameter file names. Similarly, a given sequence of steps may be retrieved for execution at a later date by pressing the OPEN button and selecting from a scrollable list of parameter files.

Each step will automatically supply a starting temperature equal to the current measured temperature for the first step, or the final temperature of the preceding step. If a temperature equal to the starting temperature is entered for the final temperature of that step, a criterion such as oxygen pressure, elapsed time or thickness of a deposited layer is necessary to terminate the step. If the final temperature is specified to be different from the starting temperature for a given step, it is necessary to also specify a heating/cooling rate. The computer then calculates the required temperature at each moment of the heating/cooling cycle and provides a continuously updated set point voltage to the substrate temperature controller.

During an oxygen admission step the computer supplies a calibrated analog voltage to an external automatic pressure controller/gas admission valve, admitting the oxygen and maintaining it at a pre-determined pressure. In a time step, the temperature and pressure parameters defined at the end of the preceding step are maintained for the specified time.

During a deposition step, some or all of the targets are sputtered in sequence until the specified thickness for each component is deposited, continuing the cycle until the total specified film thickness (e.g. 575 Å) is deposited. Deposition steps may be mixed in any order with any other steps and the amounts and proportion of each component varied from one step to the next. In the example of FIG. 8, the fourth target is gold, but it is not deposited in the step shown. At the concluding step, the mask would be inserted, the thicknesses for Y, Ba and Cu would be set to zero, and a layer of gold deposited to provide electrical contacts to the superconducting film.

By suitable definition of the steps, all processing sequences ranging from substrate and target cleaning, to deposition of a diffusion barrier on the substrate, deposition and if desired, in-situ oxidation of layered structures and deposition of electrical contact and encapsulant materials can be carried out in-situ and under automated control.

Figure 9:
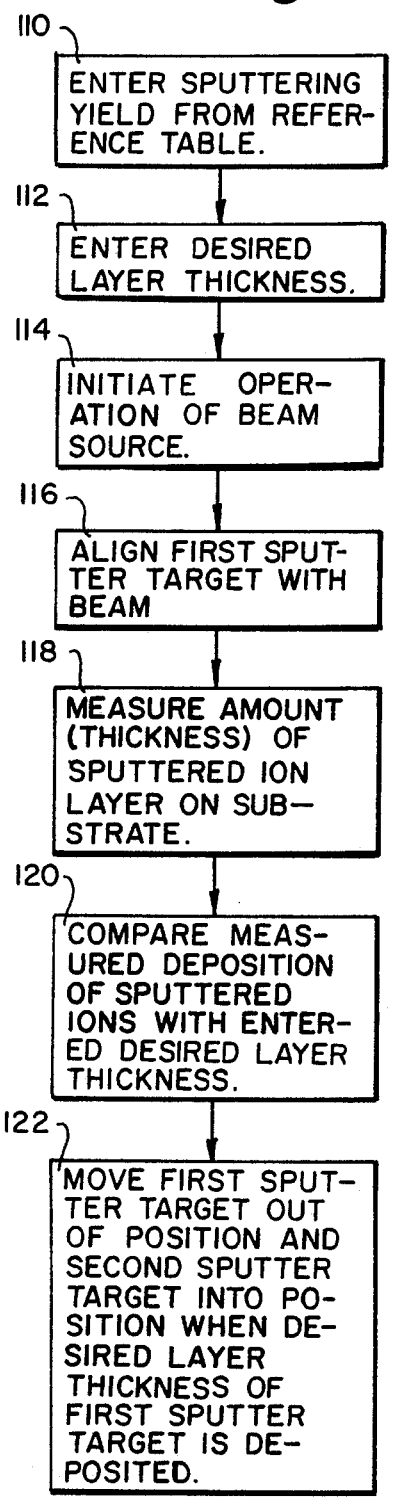
FIG. 9 is a flow chart in block diagram form of the sequence of operations carried out under computer control in a sputter-deposition system and method in accordance with the present invention as shown in FIG. 4.

Details of the logic for the deposition step are as follows: Referring to FIG. 9, there is shown in simplified block diagram form a flow chart of the operations carried out under computer control for the sputter-deposition system shown in FIG. 5. Sputtering yields for the various materials to be deposited as obtained from reference tables are entered into the computer's memory at step 110. The operator then enters the desired layer thicknesses for the various materials to be deposited at step 112. Operation of the beam source is then initiated at step 114, followed by positioning of a first sputter target in alignment with the beam as shown for the case of the first sputtering target 84 in FIG. 5. The thickness of the sputtered atom layer deposited on the substrate is then detected by the quartz crystal deposition monitor at step 118 permitting the comparison of the measured deposition of the sputtered atoms with the entered desired layer thickness at step 120. Once this comparison indicates that the desired thickness of the sputtering target has been deposited, the computer under the control of a software program stored therein then turns the beam off, moves the first sputter target out of alignment with the beam for allowing a second sputter target to be positioned in the path of the beam for sputtering of its atoms onto the deposition substrate, and then turns the beam back on. This sequence continues until all of the sputtering targets have been sequentially deposited and the cycle is repeated until a film of the desired total thickness has been deposited.

There has thus been shown an improved sputter-deposition system and method for forming multi-component thin films. The present invention makes use of a single beam which may be either ions, electrons or of the laser type. The single beam may be either fixed, where the various deposition targets are sequentially moved into alignment with the beam, or the beam may be moved by conventional deflection means to sequentially irradiate a plurality of fixed deposition targets. In either case, known sputter yields for the target materials as well as real time measurement of the thickness of deposited materials are made use of under computer control to provide accurately reproducible sputter-deposited films of arbitrary composition, as well as layered structures of arbitrary thickness.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

The embodiments of the invention in which an exclusive property or privilege is claimed are defined as follows:

1. Apparatus for the deposition of a thin film on a substrate by sequential beam-induced desorption from multiple targets, on a substrate wherein atoms of each of said targets are deposited in a layer having a predetermined thickness in a cyclic manner until a desired thickness of said film is deposited, said apparatus comprising:

beam generating means for providing a single, fixed energetic beam;

a plurality of targets each comprised of a selected composition;

displacement means coupled to said beam generating means or to each of said targets for sequentially aligning said beam with each of said targets, whereupon atoms of a target which is aligned with said beam are desorbed from said target and are deposited on the substrate;

detection means responsive to the atoms deposited on the substrate for comparing the thickness of a layer of the thus deposited atoms with said predetermined thickness;

control means coupled to said detection means and to said displacement means for removing said one of said targets from alignment with said beam and for aligning another one of said targets with said beam when the thickness of the layer of the thus deposited atoms equals said predetermined thickness for permitting atoms of said another one of said targets to be deposited on the substrate; and support means for supporting said substrate and said detection means in a spaced manner such that said beam is directed intermediate said substrate and said detection means and is incident generally normal upon the targets such that the atoms of a target aligned with said beam are desorbed from the target and directed back toward said support means and onto said substrate and said detection means, and wherein said substrate and said detection means are disposed symmetrically on opposed sides of said beam.

2. The apparatus of claim 1 wherein said displacement means includes beam deflection means for deflecting said beam sequentially onto each of said targets.

3. The apparatus of claim 2 wherein said beam is an ion beam or an electron beam and said beam deflection means includes a plurality of electrostatic deflection plates.

4. The apparatus of claim 2 wherein said beam is a laser beam and said beam deflection means includes an optical deflector arrangement.

5. The apparatus of claim 2 wherein said plurality of targets are arranged in a closely spaced, generally planar array.

6. The apparatus of claim 2 wherein said support means includes an aperture therein through which said beam is directed onto said targets and wherein the atoms of a target aligned with said beam are desorbed from said target by the beam and are directed back toward said support member and onto the substrate and said detection means.

7. The apparatus of claim 6 wherein said detection means includes a detector disposed on said support means adjacent to the aperture therein.

8. The apparatus of claim 7 wherein said deposition substrate and said detector are symmetrically disposed on said support means with respect to the aperture therein.

9. The apparatus of claim 8 wherein said detector is a quartz crystal deposition monitor.

10. The apparatus of claim 9 further comprising means for bombarding the layer of deposited atoms with electrons.

11. The apparatus of claim 2 further comprising means for forming oxide layers of the atoms deposited on the substrate.

12. The apparatus of claim 1 wherein said displacement means includes a movable support upon which said targets are positioned.

13. The apparatus of claim 12 wherein said movable support includes a rotating carousel in combination with rotary drive means for sequentially displacing each of the targets in alignment with said beam.

14. The apparatus of claim 12 wherein said detection means includes a quartz crystal deposition monitor positioned adjacent to the substrate.

15. The apparatus of claim 14 wherein said quartz crystal deposition monitor and the substrate are symmetrically positioned relative to a projected reflection of the beam from the surface of a target.

16. The apparatus of claim 14 further comprising positioning means coupled to said substrate and to said detection means for moving the substrate in a selected manner during deposition of target atoms in ensuring uniform thickness of a deposited layer of the target atoms.

17. The apparatus of claim 16 wherein said positioning means includes a rotating carousel upon which the substrate and said quartz crystal deposition monitor are positioned in combination with rotary drive means for rotationally displacing said carousel.

18. The apparatus of claim 12 further comprising an oxygen ion source for directing oxygen ions onto the substrate for forming an oxide layer.

19. The apparatus of claim 12 further comprising a movable shield disposed between the substrate and the multiple targets for isolating the substrate from the targets when one of the targets is initially irradiated by said beam.

20. The apparatus of claim 12 further comprising an apertured mask disposed between the substrate and a selected one of said targets when aligned with said beam for forming electrical contacts on the thin film, wherein said selected one of said targets is comprised of electrical contact material.

* * * * *